(12) United States Patent
Kim

(10) Patent No.: US 7,636,002 B2
(45) Date of Patent: Dec. 22, 2009

(54) CLOCK MULTIPLIER AND METHOD OF MULTIPLYING A CLOCK

(75) Inventor: Woo-Seok Kim, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 180 days.

(21) Appl. No.: 11/840,515

(22) Filed: Aug. 17, 2007

(65) Prior Publication Data

US 2008/0042698 A1 Feb. 21, 2008

(30) Foreign Application Priority Data

Aug. 18, 2006 (KR) ................ 10-2006-0077944

(51) Int. Cl.
*H03L 7/06* (2006.01)
(52) U.S. Cl. ................ 327/158; 327/116; 327/119; 327/156; 327/160
(58) Field of Classification Search ................ 327/116, 327/119–122, 156, 158, 159, 160; 331/2, 331/25, 34; 375/373–376
See application file for complete search history.

(56) References Cited

U.S. PATENT DOCUMENTS 6,052,034 A * 4/2000 Wang et al. .................. 331/2
6,064,244 A * 5/2000 Wakayama et al. .......... 327/158
6,140,854 A * 10/2000 Coddington et al. ........ 327/158
6,392,456 B1 5/2002 Pyeon et al.

FOREIGN PATENT DOCUMENTS

| JP | 2001-136060 | 5/2001 |
|----|-------------|--------|
| JP | 2002-232290 | 8/2002 |
| JP | 2003-121505 | 4/2003 |

* cited by examiner

*Primary Examiner*—Long Nguyen
(74) *Attorney, Agent, or Firm*—F. Chau & Assoc., LLC

(57) ABSTRACT

A clock multiplier for multiplying an input clock by N includes a phase/frequency detector, a clock selector, and a voltage-controlled delay line. The phase/frequency detector generates a first control signal and a second control signal according to a frequency/phase difference between the input clock and a count signal indicating a signal that is generated by delaying the input clock N times. The clock selector selects one of the input clock and a feedback clock based on the input clock and the count signal. The voltage-controlled delay line adjusts a delay time of the selected signal according to a control voltage that is generated based on the first control signal and the second control signal, and outputs the feedback clock based on the adjusted signal. The clock multiplier operates without accumulating a frequency/phase difference between the input clock and the output clock when the multiplying ratio is increased.

32 Claims, 11 Drawing Sheets

100

200

US 7,636,002 B2

CLOCK MULTIPLIER AND METHOD OF MULTIPLYING A CLOCK

CROSS-REFERENCE TO RELATED APPLICATION

This application claims priority under 35 USC § 119 to Korean Patent Application No. 2006-77944, filed on Aug. 18, 2006 in the Korean Intellectual Property Office (KIPO), the disclosure of which is incorporated herein in its entirety by reference.

BACKGROUND OF THE INVENTION

1. Technical Field

The present disclosure relates to the multiplication of a clock and, more particularly, to clock multipliers and methods of multiplying a clock without accumulating a frequency/phase difference between an input clock and an output clock when the multiplying ratio is increased.

2. Discussion of Related Art

Generally, a clock multiplier in an integrated circuit generates internal clocks used in the integrated circuit by multiplying a frequency of an input clock. That is, even though the integrated circuit receives an input clock having a lower frequency, the clock multiplier causes the integrated circuit to be capable of operating at a higher frequency.

A clock multiplier typically includes a phase locked loop (PLL) or a delay-locked loop (DLL).

FIG. 1 is a block diagram illustrating a conventional clock multiplier using a phase locked loop.

Referring to FIG. 1, a clock multiplier 100 using a phase locked loop may include a phase/frequency detector 110, a pump 120, a loop filter 130, a voltage-controlled oscillator 140, and a divider 150.

The clock multiplier 100 generates an output clock FOUT by controlling a control voltage VCON provided to the voltage-controlled oscillator 140. The output clock FOUT has a frequency that is generated by multiplying a frequency of an input clock FIN by N. For controlling the control voltage VCON, the clock multiplier 100 may include the phase/frequency detector 110, the pump 120, the loop filter 130, and a divider 150.

The phase/frequency detector 110 receives two clocks and detects a frequency/phase difference between the two received clocks. When a frequency/phase difference exists, the phase/frequency detector 110 adjusts the control voltage VCON by generating a first control signal, for example, UP, or a second control signal, for example, DN.

For example, the phase/frequency detector 110 may receive the input clock FIN and a divided clock FOUT/N corresponding to a clock that is generated by dividing a frequency of the output clock FOUT by N and may detect a frequency/phase difference between the input clock FIN and the divided clock FOUT/N. When a frequency of the divided clock FOUT/N is lower than that of the input clock FIN, the phase/frequency detector 110 may generate the first control signal, for example, UP. When the frequency of the divided clock FOUT/N is higher than that of the input clock FIN, the phase/frequency detector 110 may generate the second control signal, for example, DN.

The pump 120 generates a current for increasing or decreasing an amount of a charge of the loop filter 130 based on the first control signal and the second control signal. For example, when the first control signal is received, the pump 120 may increase the amount of the charge of the loop filter 130. When the second control signal is received, the pump 120 may decrease the amount of the charge of the loop filter 130.

The loop filter 130 generates the control voltage VCON based on the amount of the charge adjusted by the pump 120. For example, when the pump 120 increases the amount of the charge of the loop filter 130, the loop filter 130 may increase the control voltage VCON. When the pump 120 decreases the amount of the charge of the loop filter 130, the loop filter 130 may decrease the control voltage VCON.

The voltage-controlled oscillator 140 adjusts the frequency of the output clock FOUT based on the control voltage VCON. For example, the frequency of the output clock FOUT outputted from the voltage-controlled oscillator 140 may correspond to a frequency that is generated by multiplying the frequency of the input clock FIN by N.

The divider 150 divides the frequency of the output clock FOUT by N, and provides the phase/frequency detector 110 with the divided clock FOUT/N.

As described above, the clock multiplier 100 may generate the output clock FOUT having the desired frequency by multiplying the frequency of the input clock FIN by N using the phase locked loop.

The clock multiplier 100 using the phase locked loop, however, requires a specific time for adjusting the frequency/phase difference between the input clock FIN and the divided clock FOUT/N. In addition, when the frequency of the output clock FOUT does not correspond to the frequency obtained by multiplying the frequency of the input clock FIN by N, an error of the clock multiplier 100 may be accumulated until the error is corrected with respect to a next input clock FIN.

FIG. 2 is a block diagram illustrating a conventional clock multiplier using a delay-locked loop.

Referring to FIG. 2, a clock multiplier 200 using a delay-locked loop may include a phase/frequency detector 210, a pump 220, a loop filter 230, a voltage-controlled delay line 240, and an edge combiner 250.

The phase/frequency detector 210 receives two clocks and detects a frequency/phase difference between the two received clocks. When the frequency/phase difference exists, the phase/frequency detector 210 adjusts the control voltage VCON by generating a first control signal, for example, UP, or a second control signal, for example, DN.

For example, the phase/frequency detector 210 may receive the input clock FIN and a delayed clock DIN corresponding to a clock that is generated by delaying the input clock FIN by N times, and may detect a frequency/phase difference between the input clock FIN and the delayed clock DIN. When a frequency of the delayed clock DIN is lower than that of the input clock FIN, the phase/frequency detector 210 may generate the first control signal, for example, UP. When the frequency of the delayed clock DIN is higher than that of the input clock FIN, the phase/frequency detector 210 may generate the second control signal, for example, DN.

The pump 220 generates a current for increasing or decreasing an amount of a charge of the loop filter 230 based on the first control signal and the second control signal. For example, when the first control signal is received, the pump 220 may increase the amount of the charge of the loop filter 230. When the second control signal is received, the pump 220 may decrease the amount of the charge of the loop filter 230.

The loop filter 230 generates the control voltage VCON based on the amount of the charge adjusted by the pump 220. For example, when the pump 220 increases the amount of the charge of the loop filter 230, the loop filter 230 may increase the control voltage VCON. When the pump 220 decreases the amount of the charge of the loop filter 230, the loop filter 230 may decrease the control voltage VCON.

The voltage-controlled delay line 240 generates N delayed clocks by adjusting a delay of the input clock FIN based on the control voltage VCON. For example, when the control voltage VCON is increased, the voltage-controlled delay line 240 may decrease the delay of the input clock FIN and may generate the N delayed clocks. When the control voltage VCON is decreased, the voltage-controlled delay line 240 may increase the delay of the input clock FIN and may generate the N delayed clocks.

The edge combiner 250 receives the N delayed clocks outputted from the voltage-controlled delay line 240 and generates an output clock FOUT having a frequency obtained by multiplying the frequency of the input clock FIN by N based on the N delayed clocks.

As described above, the clock multiplier 200 may generate the output clock FOUT having the desired frequency by multiplying the frequency of the input clock FIN by N using the delay-locked loop.

The clock multiplier 200 using the delay-locked loop, however, has a problem that the phase/frequency difference between the delayed clocks is increased in accordance with increasing a multiplying ratio. That is, the clock multiplier 200 using the delay-locked loop may accumulate an error of the phase/frequency difference between the delayed clocks.

Therefore, despite increasing the multiplying ratio, a clock multiplier that does not accumulate the phase/frequency difference between the input clock and the output clock is required.

SUMMARY OF THE INVENTION

Accordingly, exemplary embodiments of the present invention are provided to substantially obviate one or more problems due to limitations' and disadvantages of the related art.

Exemplary embodiments of the present invention provide a clock multiplier that does not accumulate a frequency/phase difference between an input clock and an output clock when the multiplying ratio is increased.

Exemplary embodiments of the present invention provide an integrated circuit including a clock multiplier that does not accumulate a frequency/phase difference between an input clock and an output clock when the multiplying ratio is increased.

Exemplary embodiments of the present invention provide a method of multiplying a clock that does not accumulate a frequency/phase difference between an input clock and an output clock when the multiplying ratio is increased.

In exemplary embodiments of the present invention, a clock multiplier for multiplying an input clock by N includes a phase/frequency detector, a clock selector, and a voltage-controlled delay line (VCDL). The phase/frequency detector generates a first control signal and a second control signal according to a frequency/phase difference between the input clock and a count signal that indicates a signal that is generated by delaying the input clock N times. The clock selector selects one of the input clock and a feedback clock based on the input clock and the count signal. The VCDL adjusts a delay time of the selected signal according to a control voltage that is generated based on the first control signal and the second control signal, and outputs the feedback clock based on the adjusted signal.

The phase/frequency detector may delay the input clock by a predetermined time, and may generate the first control signal and the second control signal based on a frequency/phase difference between the delayed input clock and the count signal.

The phase/frequency detector may generate the first control signal when the frequency/phase of the delayed input clock precedes the frequency/phase of the count signal, and may generate the second control signal when the frequency/phase of the delayed input clock lags behind the frequency/phase of the count signal.

The phase/frequency detector may generate the first control signal when the delayed input clock is received, may generate the second control signal when the count signal is received, and may reset the first control signal and the second control signal when the first control signal and the second control signal are simultaneously generated or the frequency/phase of the input clock lags behind the frequency/phase of the count signal.

The phase/frequency detector may reset the first control signal and the second control signal at a transition time of the count signal when the frequency/phase of the input clock lags behind the frequency/phase of the count signal.

The phase/frequency detector may include an input clock delay unit, a phase/frequency detect unit, and a reset unit. The input clock delay unit may delay the input clock by the predetermined time. The phase/frequency detect unit may generate the first control signal when the delayed input clock is received, and may generate the second control signal when the count signal is received. The reset unit may reset the first control signal and the second control signal when the first control signal and the second control signal are simultaneously generated or the frequency/phase of the input clock lags behind the frequency/phase of the count signal.

The reset unit may reset the first control signal and the second control signal at a transition time of the count signal when the frequency/phase of the input clock lags behind the frequency/phase of the count signal.

The clock selector may select the delayed input clock when the count signal is generated and the clock selector does not receive the delayed input clock. Otherwise, the clock selector may select an inverted signal of the feedback clock outputted from the VCDL.

The clock selector may include a mode determination unit and a clock selection unit. The mode determination unit may receive the count signal and an inverted signal of the delayed input clock. The clock selection unit may select one of the delayed input clock and the inverted signal of the feedback clock based on an output signal of the mode determination unit.

The clock selection unit may select the delayed input clock when the output signal of the mode determination unit corresponds to the first logic level, and may select the inverted signal of the feedback clock when the output signal of the mode determination unit corresponds to the second logic level.

The clock multiplier may further include a loop filter and a pump. The loop filter may generate the control voltage. The pump may adjust an amount of charge of the loop filter based on the first control signal and the second control signal.

The clock multiplier may further include a counter that may generate the count signal based on an inverted signal of the feedback clock.

The counter may output the count signal when the inverted signal of the feedback clock is received at an N-th time.

In exemplary embodiments of the present invention, an integrated circuit includes a clock multiplier that receives an input clock from an external source and multiplies the input clock by N. The clock multiplier includes a phase/frequency detector, a clock selector, and a voltage-controlled delay line (VCDL). The phase/frequency detector generates a first control signal and a second control signal according to a frequency/phase difference between the input clock and a count signal that represents a signal generated by delaying the input clock N times. The clock selector selects one of the input clock and a feedback clock based on the input clock and the count signal. The VCDL adjusts a delay time of the selected signal according to a control voltage that is generated based on the first control signal and the second control signal, and outputs the feedback clock based on the adjusted signal.

The phase/frequency detector may delay the input clock by a predetermined time, and may generate the first control signal and the second control signal based on a frequency/phase difference between the delayed input clock and the count signal.

The phase/frequency detector may generate the first control signal when the frequency/phase of the delayed input clock precedes the frequency/phase of the count signal, and may generate the second control signal when the frequency/phase of the delayed input clock lags behind the frequency/phase of the count signal.

The phase/frequency detector may generate the first control signal when the delayed input clock is received, may generate the second control signal when the count signal is received, and may reset the first control signal and the second control signal when the first control signal and the second control signal are simultaneously generated or the frequency/phase of the input clock lags behind the frequency/phase of the count signal.

The phase/frequency detector may reset the first control signal and the second control signal at a transition time of the count signal when the frequency/phase of the input clock lags behind the frequency/phase of the count signal.

The phase/frequency detector may include an input clock delay unit, a phase/frequency detect unit, and a reset unit. The input clock delay unit may delay the input clock by the predetermined time. The phase/frequency detect unit may generate the first control signal when the delayed input clock is received, and may generate the second control signal when the count signal is received. The reset unit may reset the first control signal and the second control signal when the first control signal and the second control signal are simultaneously generated or the frequency/phase of the input clock lags behind the frequency/phase of the count signal.

The reset unit may reset the first control signal and the second control signal at a transition time of the count signal when the frequency/phase of the input clock lags behind the frequency/phase of the count signal.

The clock selector may select the delayed input clock when the count signal is generated and the clock selector does not receive the delayed input clock. Otherwise, the clock selector may select an inverted signal of the feedback clock outputted from the VCDL.

The clock selector may include a mode determination unit, and a clock selection unit. The mode determination unit may receive the count signal and an inverted signal of the delayed input clock. The clock selection unit may select one of the delayed input clock and an inverted signal of the feedback clock based on an output signal of the mode determination unit.

The clock selection unit may select the delayed input clock when the output signal of the mode determination unit corresponds to the first logic level, and may select the inverted signal of the feedback clock when the output signal of the mode determination unit corresponds to the second logic level.

The integrated circuit may further include a loop filter and a pump. The loop filter may generate the control voltage. The pump may adjust an amount of charge of the loop filter based on the first control signal and the second control signal.

The integrated circuit may further include a counter that may generate the count signal based on an inverted signal of the feedback clock.

The counter may output the count signal when the inverted signal of the feedback clock is received at an N-th time.

In a method of multiplying a clock according to exemplary embodiments of the present invention, a first control signal and a second control signal are generated according to a frequency/phase difference between the input clock and a count signal that indicates a signal that is generated by delaying the input clock N times. One of the input clock and a feedback clock is selected based on the input clock and the count signal. A delay time of the selected signal is adjusted according to a control voltage that is generated based on the first control signal and the second control signal. The feedback clock is outputted based on the adjusted signal.

The first control signal and the second control signal may be generated by delaying the input clock by a predetermined time and by generating the first control signal and the second control signal based on a frequency/phase difference between the delayed input clock and the count signal.

In an exemplary embodiment, the first control signal and the second control signal may be generated based on the frequency/phase difference between the delayed input clock and the count signal by generating the first control signal when the frequency/phase of the delayed input clock precedes the frequency/phase of the count signal and by generating the second control signal when the frequency/phase of the delayed input clock lags behind the frequency/phase of the count signal.

In an exemplary embodiment, the first control signal and the second control signal may be generated based on the frequency/phase difference between the delayed input clock and the count signal by generating the first control signal when the delayed input clock is received, by generating the second control signal when the count signal is received; and by resetting the first control signal and the second control signal when the first control signal and the second control signal are simultaneously generated or the frequency/phase of the input clock lags behind the frequency/phase of the count signal.

The first control signal and the second control signal may be reset at a transition time of the count signal when the frequency/phase of the input clock lags behind the frequency/phase of the count signal.

One signal between the input clock and the feedback clock may be selected by selecting the delayed input clock when the count signal is generated and the clock selector does not receive the delayed input clock, otherwise, by selecting an inverted signal of the feedback clock outputted from the VCDL.

Therefore, the clock multiplier does not accumulate the frequency/phase difference between the input clock and the output clock even though the multiplying ratio is increased. Also, the clock multiplier can eliminate the accumulated jitter when the output clock precedes the input clock.

BRIEF DESCRIPTION OF THE DRAWINGS

Exemplary embodiments of the present invention will be understood in more detail from the following descriptions taken in conjunction with the accompanying drawings.

DESCRIPTION OF EXEMPLARY EMBODIMENTS

Figure 1:
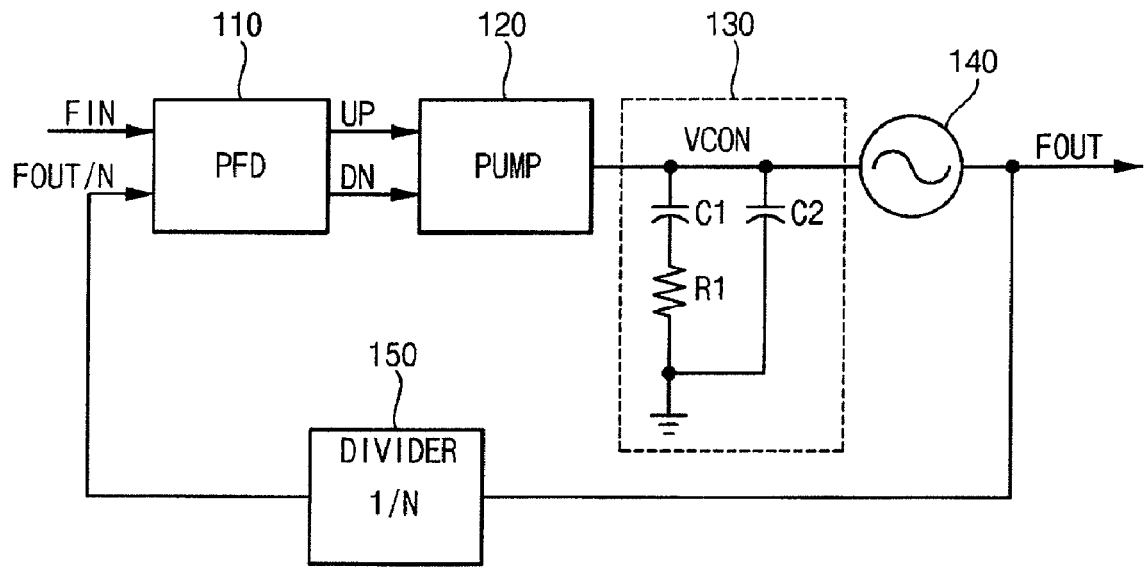
FIG. 1 is a block diagram illustrating a conventional clock multiplier using a phase locked loop.
Figure 2:
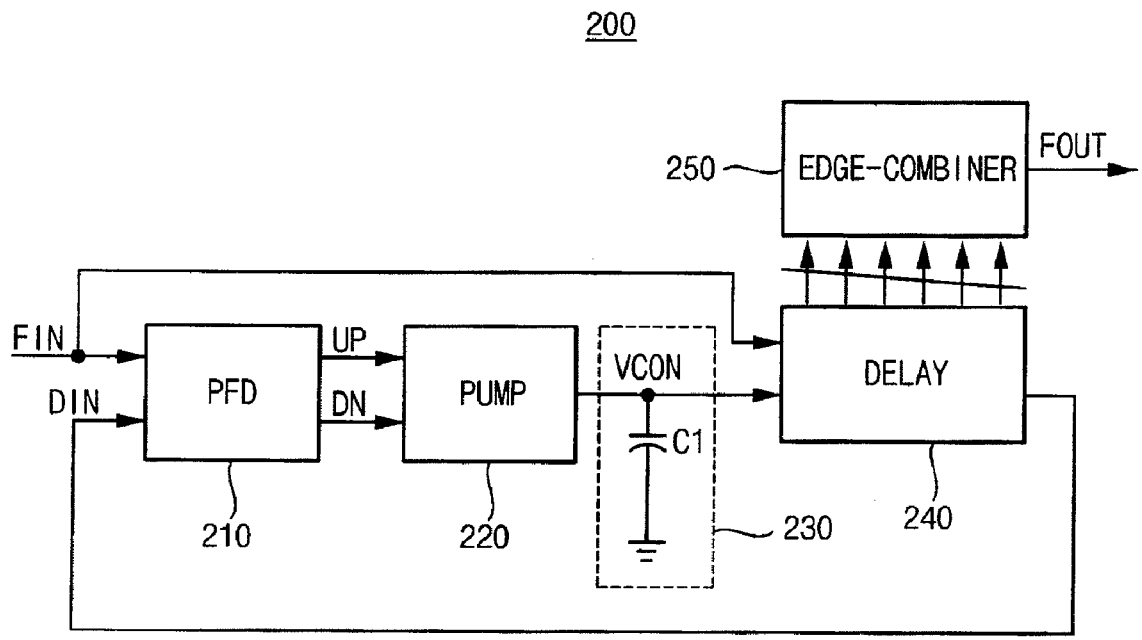
FIG. 2 is a block diagram illustrating a conventional clock multiplier using a delay-locked loop.

Exemplary embodiments of the present invention now will be described more fully with reference to the accompanying drawings, in which exemplary embodiments of the invention are shown. The present invention may, however, be embodied in many different forms and should not be construed as limited to the exemplary embodiments set forth herein. Rather, these exemplary embodiments are provided so that this disclosure will be thorough and complete, and will fully convey the scope of the invention to those of ordinary skill in the art. Like reference numerals refer to like elements throughout this application.

Figure 3:
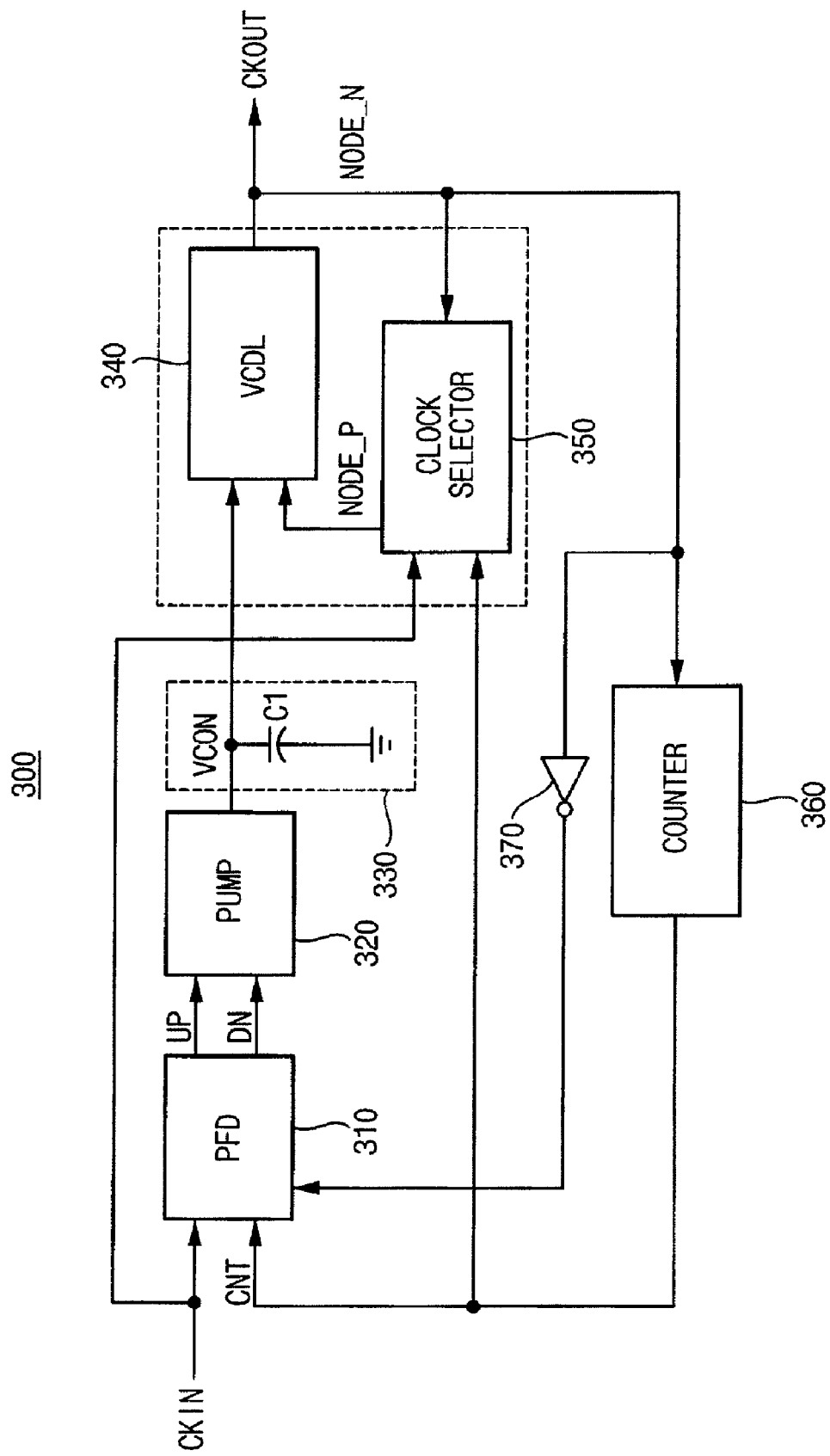
FIG. 3 is a block diagram illustrating a clock multiplier according to an exemplary embodiment of the present invention.

FIG. 3 is a block diagram illustrating a clock multiplier according to an exemplary embodiment of the present invention.

Referring to FIG. 3, a clock multiplier 300 includes a phase/frequency detector 310, a pump 320, a loop filter 330, a voltage-controlled delay line 340, a clock selector 350, a counter 360, and an inverter 370.

The phase/frequency detector 310 receives two clocks, and detects a frequency/phase difference between the two clocks. When the frequency/phase difference exists, the phase/frequency detector 310 adjusts the control voltage VCON by generating a first control signal, for example, UP or a second control signal, for example, DN.

That is, the phase/frequency detector 310 generates the first control signal and the second control signal according to the frequency/phase difference between an input clock CKIN and a count signal CNT indicating that the input clock is delayed by N times.

For example, the phase/frequency detector 310 may receive the input clock CKIN and the count signal CNT that is generated when the voltage-controlled delay line 340 delays the input clock CKIN N times, and may detect the frequency/phase difference between the input clock CKIN and the count signal CNT. When the count signal CNT lags behind the input clock CKIN, the phase/frequency detector 310 may generate the first control signal UP. When the count signal CNT precedes the input clock CKIN, the phase/frequency detector 310 may generate the second control signal DN.

The pump 320 generates a current for increasing or decreasing an amount of charge of the loop filter 330 based on the first control signal and the second control signal. For example, when the first control signal (UP) is received, the pump 320 may increase the amount of the charge of the loop filter 330. When the second control signal (DN) is received, the pump 320 may decrease the amount of the charge of the loop filter 330.

The loop filter 330 generates the control voltage VCON based on the amount of the charge adjusted by the pump 320. For example, when the pump 320 increases the amount of the charge of the loop filter 330, the loop filter 330 may increase the control voltage VCON. When the pump 320 decreases the amount of the charge of the loop filter 330, the loop filter 330 may decrease the control voltage VCON.

The clock selector 350 selects one signal from the input clock CKIN and a feedback clock outputted from the voltage-controlled delay line 340 at so-called NODE_N.

The voltage-controlled delay line 340 generates a delay clock by adjusting a delay of the input clock CKIN based on the control voltage VCON, when the input clock CKIN is selected by the clock selector 350. For example, when the control voltage VCON is increased, the voltage-controlled delay line 340 generates the delay clock by decreasing the delay of the input clock CKIN. When the control voltage VCON is decreased, the voltage-controlled delay line 340 generates the delay clock by increasing the delay of the input clock CKIN.

More specifically, the voltage-controlled delay line 340 adjusts the delay time of the signal at NODE_P selected from the clock selector 350 according to the control voltage VCON that is generated based on the first control signal and the second control signal, and outputs the feedback clock at NODE_N based on the adjusted signal.

The counter 360 performs a counting operation on the feedback clock outputted from the voltage-controlled delay line 340. For example, when the counter 360 receives the feedback clock N times, the counter 360 may output the count signal CNT As will be explained in FIG. 4, the phase/frequency detector 310 also receives an inverted feedback signal from inverter 370.

Figure 4:
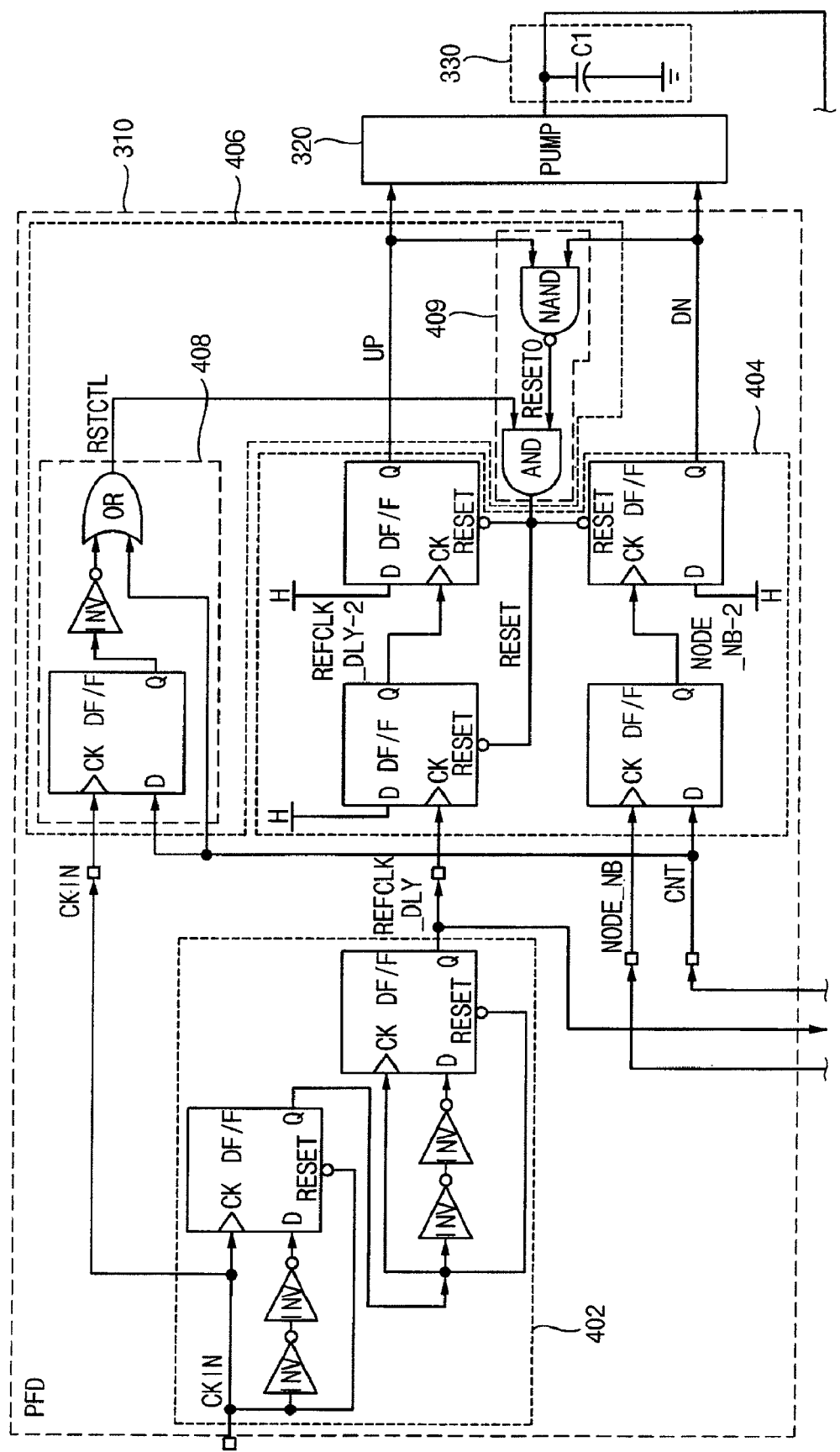
FIG. 4 is a block diagram illustrating an example of the phase/frequency detector used in the clock multiplier shown in FIG. 3.

FIG. 4 is a block diagram illustrating an example of the phase/frequency detector 310 shown in FIG. 3.

Referring to FIG. 4, the phase/frequency detector 310 includes an input clock delay unit 402, a phase/frequency detect unit 404, and a reset unit 406 including a reset control unit 408 and a reset signal generating unit 409.

The input clock delay unit 402 delays the input clock CKIN by a predetermined time, and the input clock delay unit 402 may be implemented using D flip-flops, for example.

The phase/frequency detect unit 404 generates the first control signal when the delayed input clock REFCLK_DLY is received from the input clock delay unit 402, and generates the second control signal when the count signal CNT is received, For example, the phase/frequency detect unit 404 may be implemented using D flip-flops.

The reset unit 406 resets the phase/frequency detect unit 404 when the first. control signal and the second control signal are simultaneously generated or the frequency/phase of the input clock CKIN lags behind the frequency/phase of the count signal CNT from the counter 360 of FIG. 3. For example, the reset unit 406 may reset Is the first control signal and the second control signal at a transition time of the count signal CNT when the frequency/phase of the input clock CKIN lags behind the frequency/phase of the count signal CNT. The feedback signal at NODE_N is used as a clock signal NODE_NB fed to one of the D flip-flops used in the phase/frequency detect unit 404 after having been passed through the inverter 370. 20 Hereinafter, the operation of the phase/frequency detector 310 is described.

The phase/frequency detector 310 delays the input clock CKIN by the predetermined time, and generates the first control signal and the second control signal based on the frequency/phase difference between the delayed input clock REFCLK_DLY and the count signal CNT outputted from the counter 360 shown in FIG. 3. For example, the phase/frequency detector 310 generates the first control signal when the frequency/phase of the delayed input clock REFCLK_DLY precedes the frequency/phase of the count signal CNT, and generates the second control signal when the frequency/phase of the delayed input clock REFCLK_DLY lags behind the frequency/phase of the count signal CNT.

That is, the phase/frequency detector 310 generates the first control signal when the delayed input clock REFCLK_DLY is received, generates the second control signal when the count signal CNT is received, and resets the phase/frequency detect unit 404 that generates the first control signal and the second control signal when the first control 1o signal and the second control signal are simultaneously generated or the frequency/phase of the input clock CKIN lags behind the frequency/phase of the count signal CNT. For example, the phase/frequency detector 310 may reset the first control signal and the second control signal at the transition time of the count signal CNT when the frequency/phase of the input clock CKIN lags behind the frequency/phase of the count signal CNT.

Figure 5:
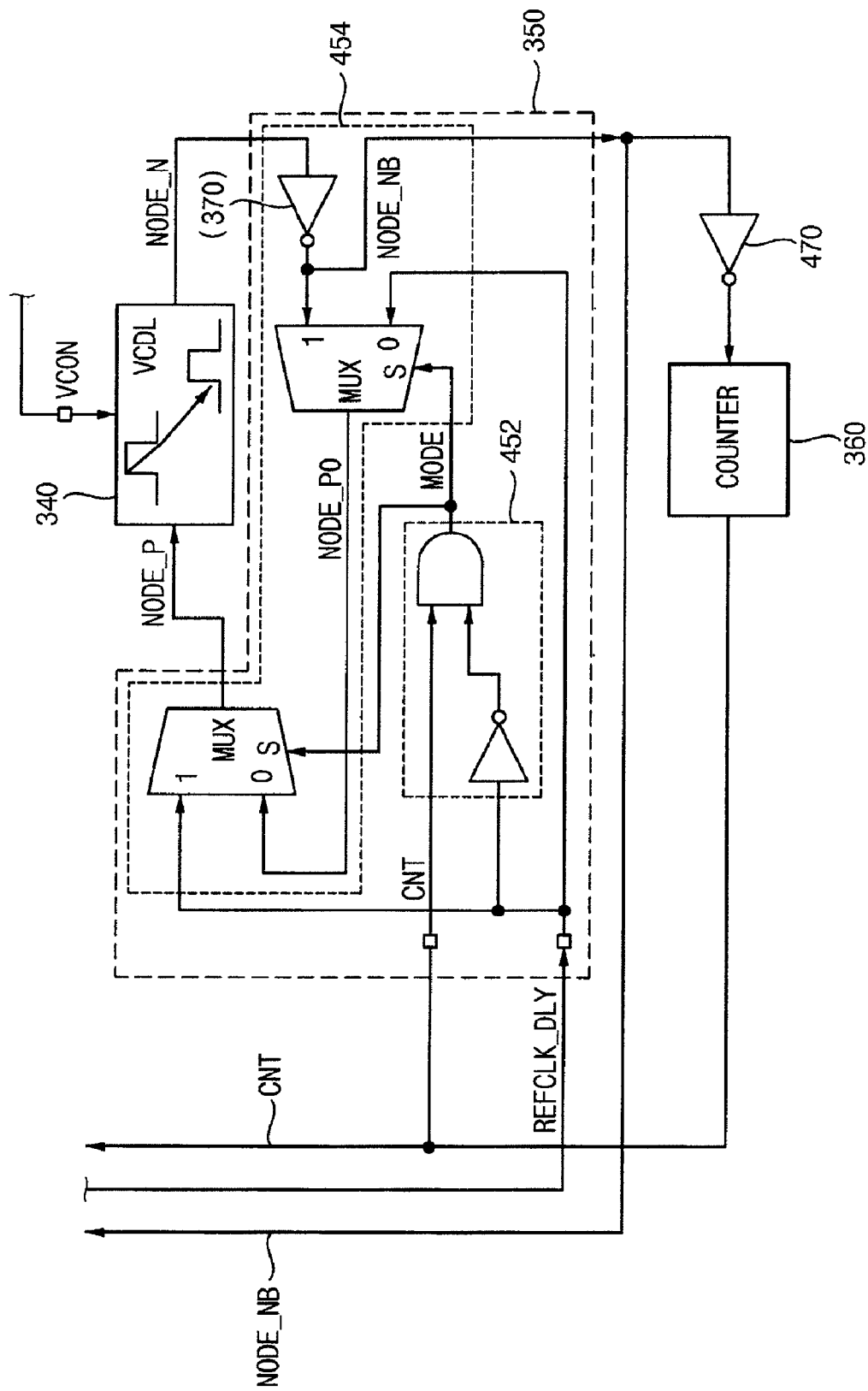
FIG. 5 is a block diagram illustrating an example of the clock selector used in the clock multiplier shown in FIG. 3.

FIG. 5 is a block diagram illustrating an example of the clock selector 350 shown in FIG. 3.

Referring to FIG. 5, the clock selector 350 may include a mode determination unit 452, and a clock selection unit 454.

The mode determination unit 452 receives the count signal CNT and an inverted signal of the delayed input clock REFCLK_DLY, and determines an operation mode of the clock selector 350 based on the count signal CNT and the inverted signal.

The clock selection unit 454 selects one signal from the delayed input clock REFCLK_DLY and an inverted signal of the feedback clock based on the output signal MODE of the mode determination unit 452. For example, the clock selection unit 454 may select the delayed input clock REFCLK_DLY when the output signal MODE of the mode determination unit 452 corresponds to a first logic level, and may select the inverted signal NODE_NB of the feedback clock when the output signal of the mode determination unit 452 corresponds to a second logic level.

Therefore, the clock selector 350 selects one signal from the input clock CKIN and the feedback clock according to the operation mode determined by the mode determination unit 452.

Because the counter 360 counts the feedback clock in its non-inverted state, 10 inverter 470 returns the feedback clock to its original state NODE_N. The inversion of the feedback clock signal NODE_N performed by the clock selection unit 454 is represented by the inverter 370 of FIG. 3 providing the inverted feedback signal NODE_NB to the phase/frequency detector 310, as shown in FIG. 4.

Hereinafter, the operation of the clock selector 350 is described.

The clock selector 350 selects the delayed input clock REFCLK_DLY when the count signal CNT is generated and the clock selector 350 does not receive the delayed input clock REFCLK_DLY: otherwise, the clock selector 350 selects the inverted signal of the feedback clock outputted from the voltage-controlled delay line 340.

Figure 6:
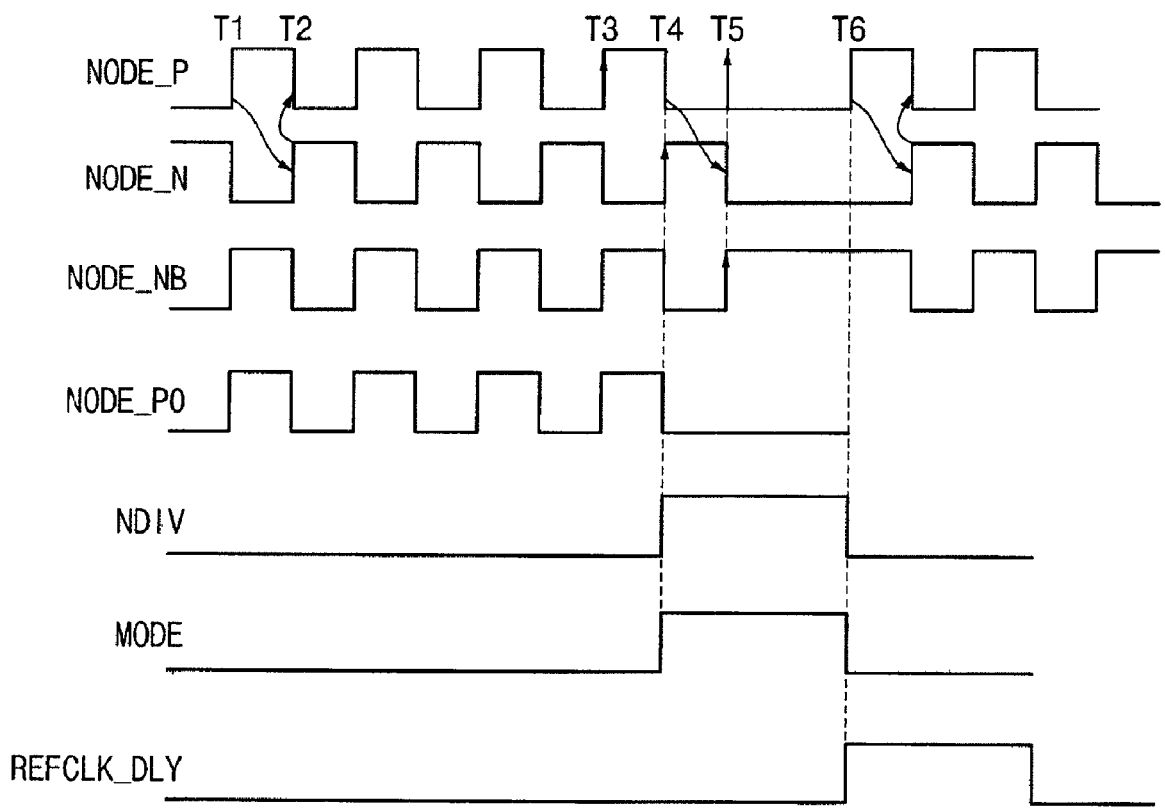
FIG. 6 is a timing diagram illustrating an operation of the clock selector shown in FIG. 5.

FIG. 6 is a timing diagram illustrating an operation of the clock selector in FIG. 5.

A first node NODE_P represents the clock selected from the clock selector 350, a second node NODE_N represents the feedback clock outputted from the voltage-controlled delay line 340, and the third node NODE_NB represents the inverted clock of the feedback clock.

When a time point T3 of the first node NODE_P is a generating time of the delayed clock that is delayed from the input clock CKIN by N times, a time point T4 of the second node NODE_N represents a generating time of the N-th feedback clock, and a time point T5 of the third node NODE_NB represents a generating time of the (N+1)-th delayed clock.

That is, the time point T5 of the third node NODE_NB is identical with the generating time of the input clock CKIN. When the time point T5 of the third node NODE_NB is not identical with the generating time of the input clock CKIN, the clock selector 350 may provide the input clock CKIN to the voltage-controlled delay line 340 for adjusting the frequency/phase difference between the input clock CKIN and the feedback clock. That is, when the N-th delayed clock precedes the input clock CKIN, the clock selector 350 may eliminate an accumulated jitter by selecting the input clock CKIN.

In FIG. 6, because the generating time of the delayed input clock REFCLK_DLY lags behind the time point T5 of the third node NODE_NB, the mode determination unit 452 generates the mode signal. When the mode signal is generated, the clock selection unit 454 provides the input clock CKIN to the voltage-controlled delay line 340 for adjusting the frequency/phase difference between the input clock CKIN and the feedback clock.

Figure 7:
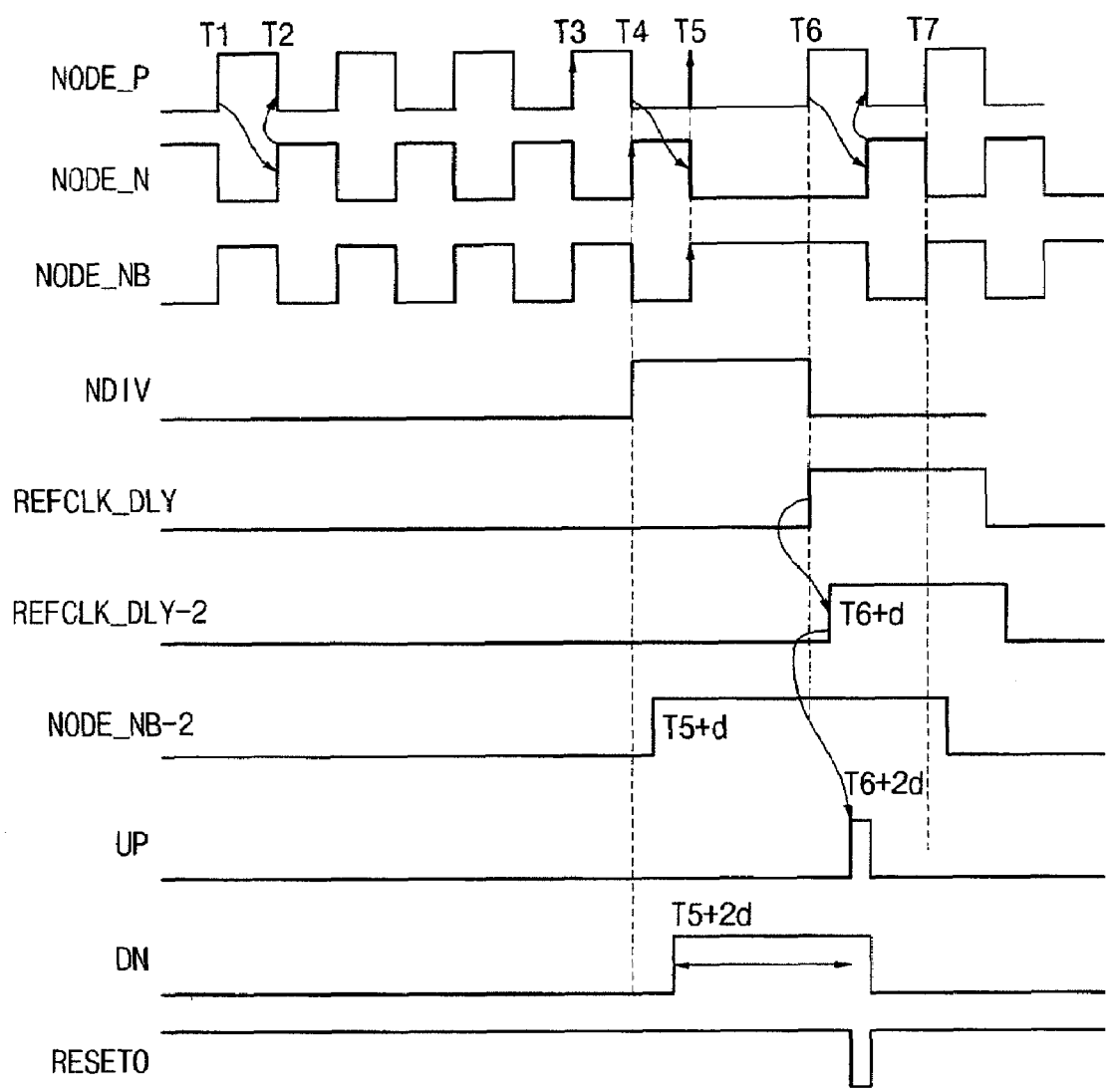
FIG. 7 is a timing diagram illustrating an operation of the phase/frequency detector with respect to the operation of the clock selector illustrated in FIG. 6.

FIG. 7 is a timing diagram illustrating an operation of the phase/frequency 20 detector with respect to the operation of the clock selector illustrated in FIG. 6.

A first node NODE_P represents the clock selected from the clock selector 350, a second node NODE_N represents the feedback clock outputted from the voltage-controlled delay line 340, and the third node NODE_NB represents the inverted clock of the feedback clock.

When a time point T3 of the first node NODE_P is a generating time of the delayed clock that is delayed from the input clock CKIN by N times, a time point T4 of the second node NODE_N represents a generating time of the N-th feedback clock, and a time point T5 of the third node NODE_NB represents a generating time of the (N+1)-th delayed clock.

That is, the time point T5 of the third node NODE_NB is identical with the generating time of the input clock CKIN. When the time point T5 of the third node NODE_NB is not identical with the generating time of the input clock CKIN, the phase/frequency detector 310 generates the first control signal and the second control signal for adjusting the frequency/phase difference between the input clock CKIN and the N-th feedback clock.

In FIG. 7, because the generating time of the delayed input clock REFCLK_DLY lags behind the time point T5 of the third node NODE_NB, the phase/frequency detector 310 generates the second control signal, for example, DN, for adjusting the frequency/phase difference between the input clock CKIN and the N-th feedback clock. On the other hand, when the first control signal and the second control signal are simultaneously generated, the reset unit 406 of the phase/frequency detector 310 generates a reset signal RESET0, also shown in FIG. 4, and resets the phase/frequency detect unit 404.

Figure 8:
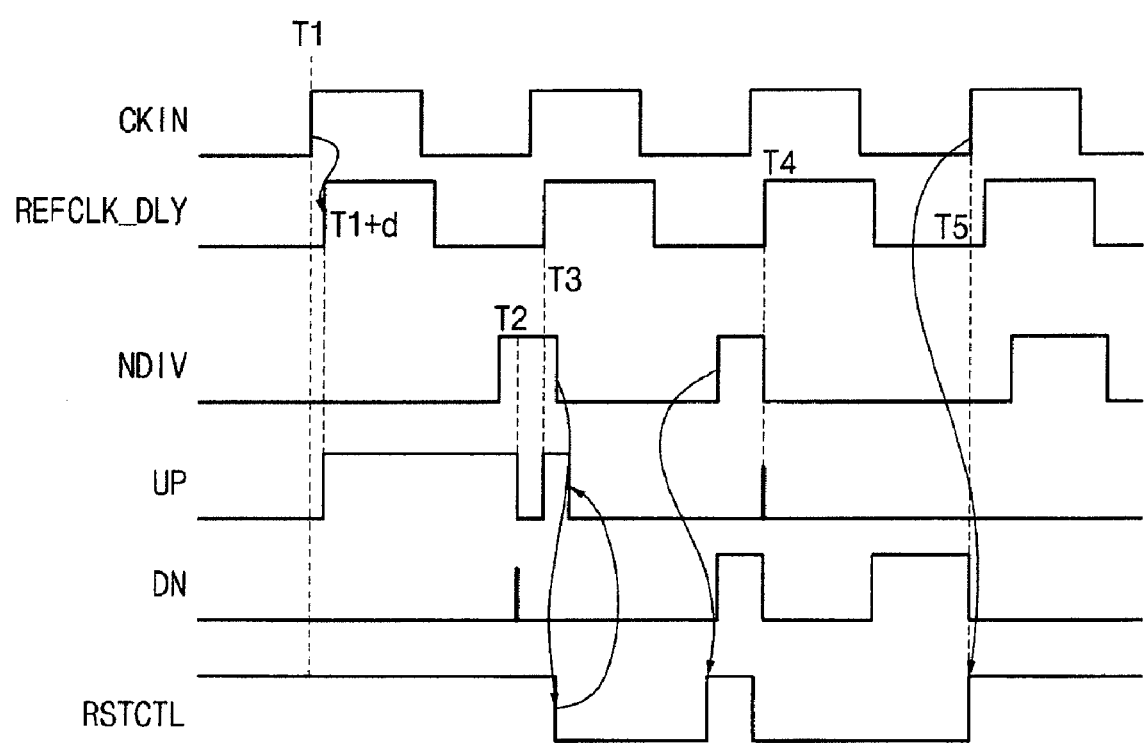
FIG. 8 is a timing diagram illustrating a process of generating a reset control signal in the reset unit used in the phase/frequency detector shown in FIG. 4.

FIG. 8 is a timing diagram illustrating a process of generating a reset control signal RSTCTL in the reset unit 409 shown in FIG. 4.

When the control voltage VCON provided to the voltage-controlled delay line 340 is low at an initial operation time of the clock multiplier 300, the count signal CNT may be generated after several clock cycles of the input clock CKIN.

When the count signal CNT is generated after the several clock cycles of the input clock CKIN, the phase/frequency detector 310 generates only the first control signal, for example, UP, while the count signal CNT is not generated. Therefore, the control voltage VCON is continuously increased until the control voltage VCON becomes equal to a power supply voltage that is a maximum voltage.

For solving the above-described problem, the reset unit 406 generates the reset control signal RSTCTL, also shown in FIG. 4, for resetting the first control signal and the second control signal when the frequency/phase of the input clock CKIN lags behind the frequency/phase of the count signal CNT. That is, the reset unit 406 generates the reset 10 control signal RSTCTL when the clock outputted from the first node NODE_P precedes the input clock CKIN.

If the count signal CNT has a first logic level, for example, logic high, at a rising edge of the input clock CKIN, the reset unit 406 generates the reset control signal RSTCTL for resetting the phase/frequency detector 310 when the count signal CNT is changed to a second logic level, for example, logic low, from the first logic level, for example, logic high.

Figure 9:
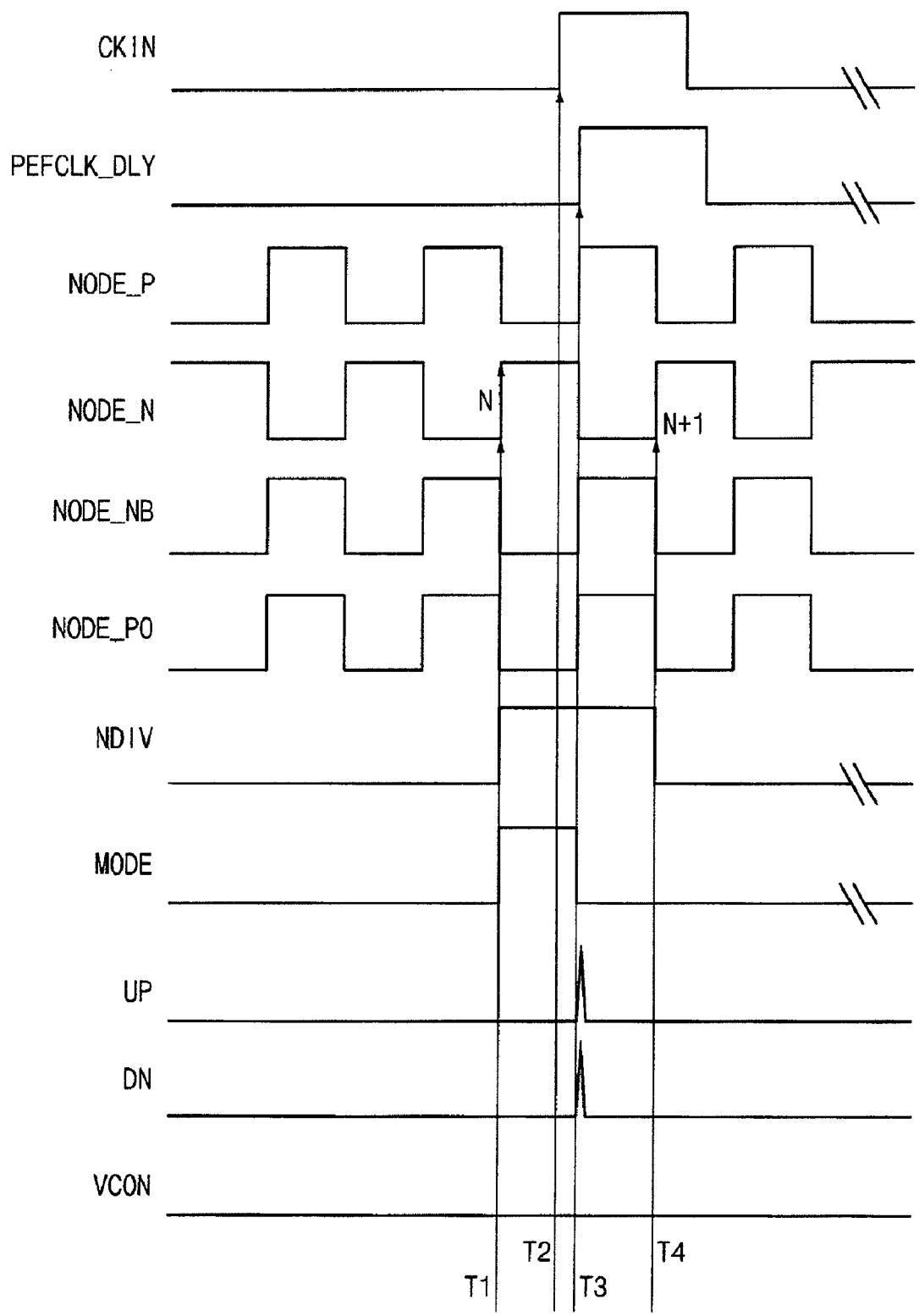
FIG. 9 is a timing diagram illustrating an operation of the clock multiplier according to an exemplary embodiment of the present invention when the delayed input clock is equal to the clock outputted from the first node.

FIG. 9 is a timing diagram illustrating an operation of the clock multiplier according to an exemplary embodiment of the present invention when the delayed input clock REFCLK_DLY is equal to the clock outputted from the first node NODE_P.

Figure 10:
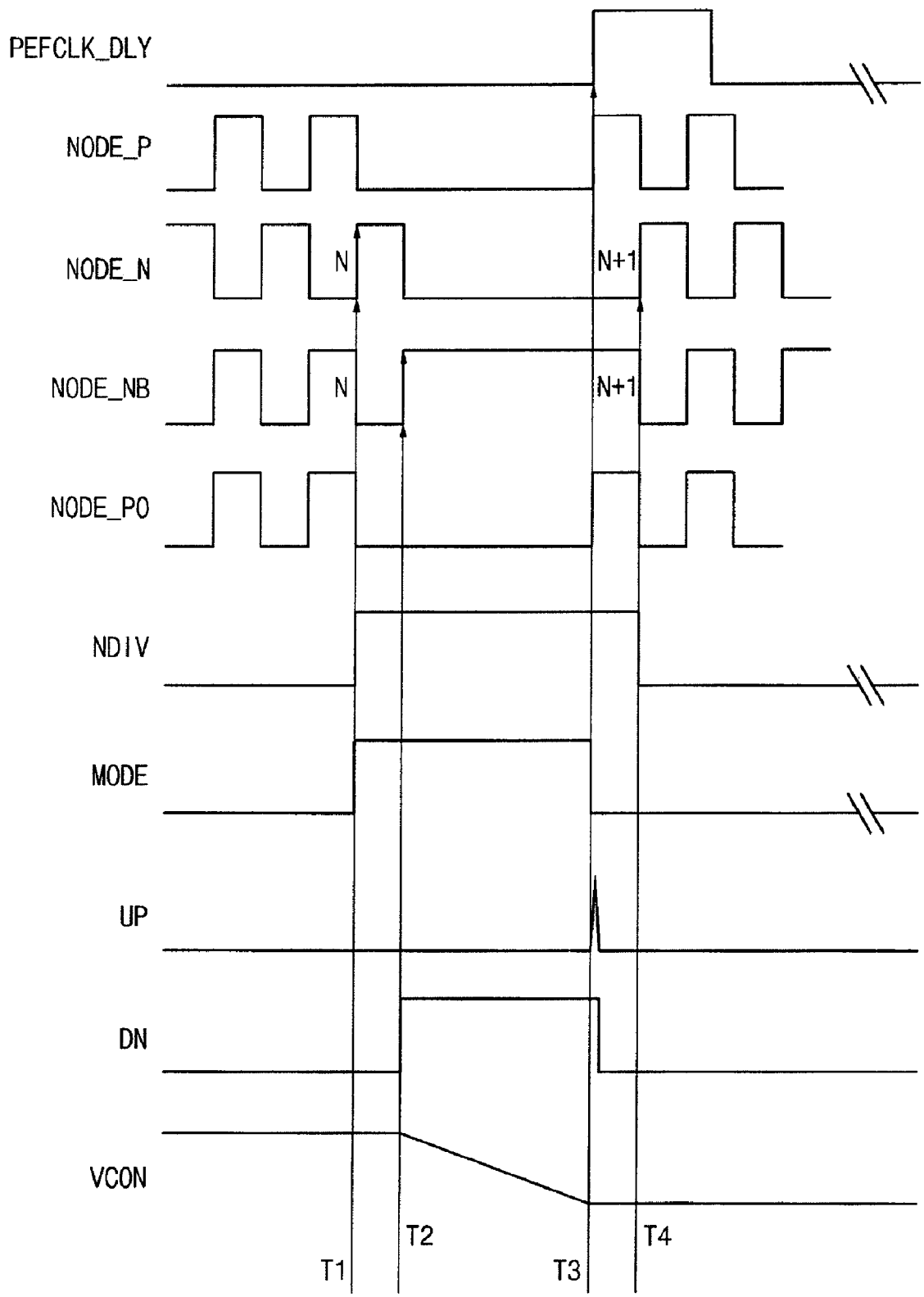
FIG. 10 is a timing diagram illustrating an operation of the clock multiplier according to an exemplary embodiment of the present invention when the delayed input clock lags behind the clock outputted from the first node.

FIG. 10 is a timing diagram illustrating an operation of the clock multiplier according to an exemplary embodiment of the present invention when the delayed input clock REFCLK_DLY lags behind the clock outputted from the first node NODE_P.

Figure 11:
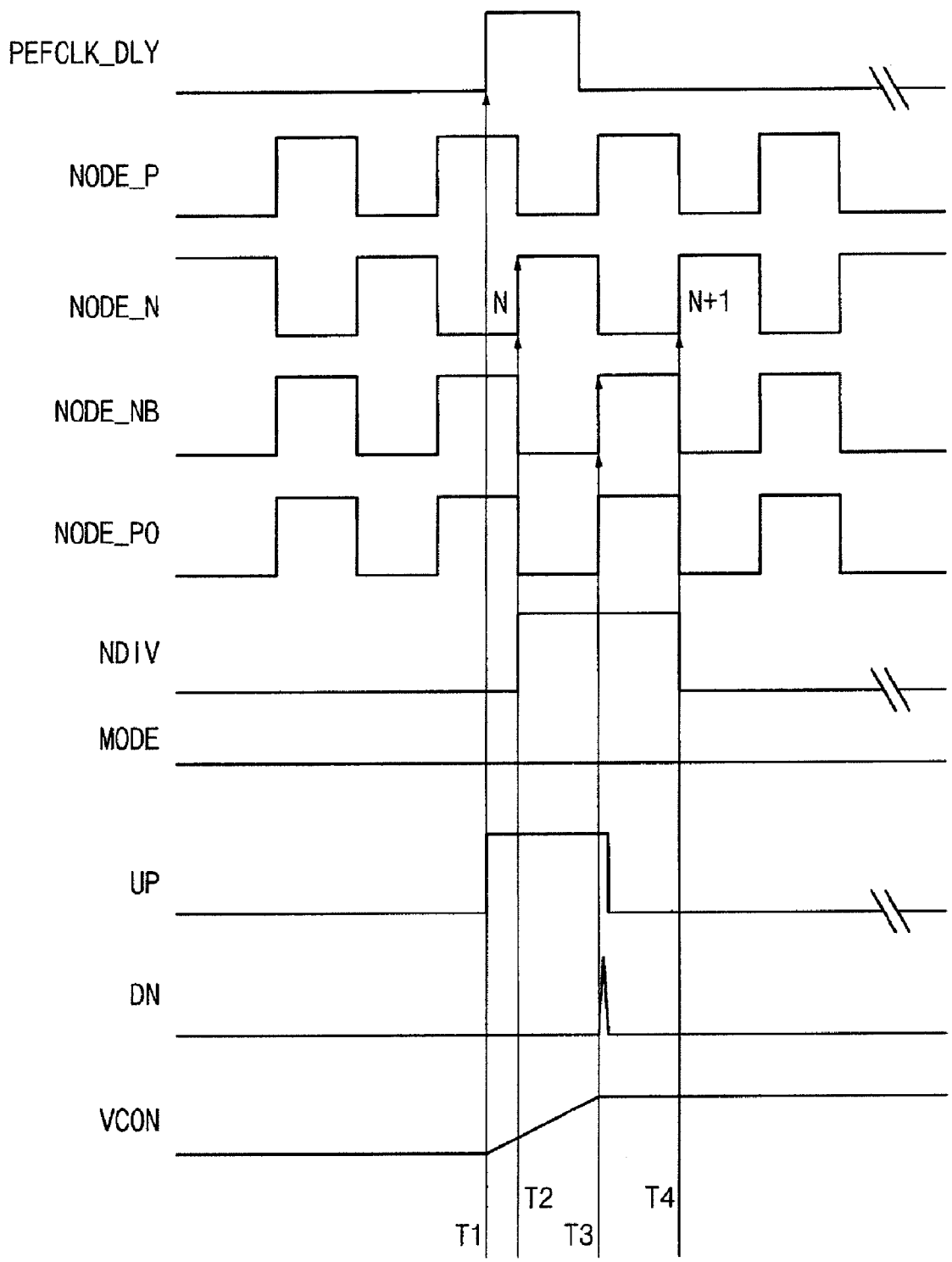
FIG. 11 is a timing diagram illustrating an operation of the clock multiplier according to an exemplary embodiment of the present invention when the delayed input clock precedes the clock outputted from the first node.

FIG. 11 is a timing diagram illustrating an operation of the clock multiplier according to an exemplary embodiment of the present invention when the delayed input clock REFCLK_DLY precedes the clock outputted from the first node NODE_P.

Referring to FIG. 9, when the delayed input clock REFCLK_DLY is equal to the clock outputted from the first node NODE_P, the clock selector 350 selects one signal from the delayed input clock REFCLK_DLY and the N-th delayed clock, and the phase/frequency detector 310 does not generate the first control signal and the second control signal.

Referring to FIG. 10, when the delayed input clock REFCLK_DLY lags behind the clock outputted from the first node NODE_P, the clock selector 350 selects the delayed input clock REFCLK_DLY from the delayed input clock REFCLK_DLY and the N-th delayed clock, and the phase/frequency detector 310 generates the second control signal, for example, DN, for adjusting the frequency/phase difference between the delayed input clock REFCLK_DLY and the N-th delayed clock, that is, the clock outputted from the first node NODE_P.

Referring to FIG. 11, when the delayed input clock REFCLK_DLY precedes the clock outputted from the first node NODE_P, the clock selector 350 selects the N-th delayed clock from the delayed input clock REFCLK_DLY and the N-th delayed clock, and the phase/frequency detector 310 generates the first control signal, for example, UP for adjusting the frequency/phase difference between the delayed input clock REFCLK_DLY and the N-th delayed clock, that is, the clock outputted from the first node NODE_P.

FIG. 12A through FIG. 12D are graphs illustrating simulation results of a clock multiplier according to an exemplary embodiment of the present invention.

In FIG. 12A through FIG. 12D, it is assumed that the input clock cycle is $1/128$ nsec, N is 64, and a target value of the output clock is 2 nsec.

Figure 12A:
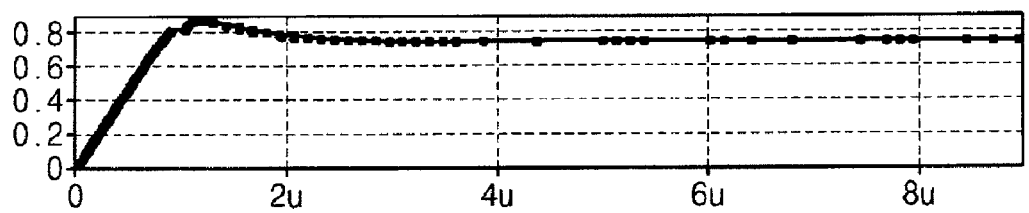
FIG. 12A through FIG. 12D are graphs illustrating simulation results of a clock multiplier according to an exemplary embodiment of the present invention.
Figure 12B:
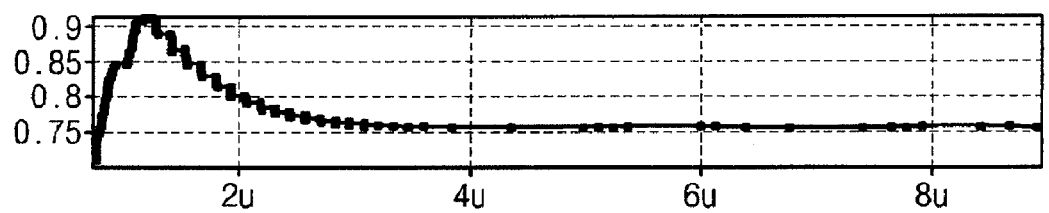

FIG. 12A illustrates a result in which the control voltage VCON is gradually converged and shows that a ripple of the control voltage VCON is below 0.1 mV when the control voltage VCON is converged. FIG. 12B is an enlarged version of the upper portion of the graph of FIG. 12A.

Figure 12C:
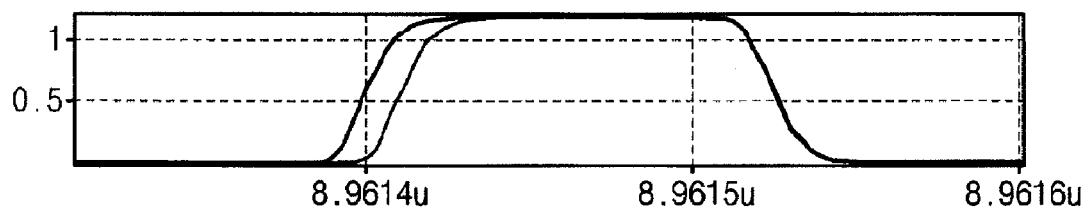

FIG. 12C illustrates the first control signal and the second control signal, for example, UP and DN, in locking condition wherein the frequency/phase difference between the input clock CKIN and the N-th delayed clock is equal, and illustrates that a pulse width difference between the first control signal and the second control signal is below 10 ps.

Figure 12D:
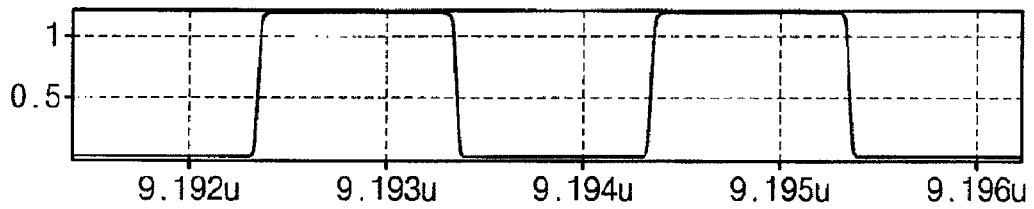

FIG. 12D illustrates a target value of the output clock, and shows that a duty ratio of the output clock corresponds to about 50%.

As described above, the clock multiplier according to exemplary embodiments of the present invention can operate without accumulating the frequency/phase difference between the input clock and the output clock when the multiplying ratio is increased.

Also, the clock multiplier according to exemplary embodiments of the present invention can eliminate accumulated jitter when the output clock precedes the input clock.

While exemplary embodiments of the present invention and their advantages have been described in detail, it should be understood that various changes, substitutions and alterations may be made herein without departing from the scope of the invention.

What is claimed is:

1. A clock multiplier for multiplying an input clock by N, comprising:
   a phase/frequency detector configured to generate a first control signal and a second control signal according to a frequency/phase difference between the input clock and a count signal fed thereto, the count signal corresponding to a signal that is generated by delaying the input clock N times;
   a clock selector configured to select one of the input clock and a feedback clock based on the input clock and the count signal; and
   a voltage-controlled delay line (VCDL) configured to adjust a delay time of the selected signal from the clock selector according to a control voltage that is generated based on the first control signal and the second control signal, and configured to output the feedback clock based on the adjusted delay time.

2. The clock multiplier of claim 1, wherein the phase/frequency detector delays the input clock by a predetermined time, and generates the first control signal and the second control signal based on a frequency/phase difference between the delayed input clock and the count signal.

3. The clock multiplier of claim 2, wherein the phase/frequency detector generates the first control signal when the frequency/phase of the delayed input clock precedes the frequency/phase of the count signal, and generates the second control signal when the frequency/phase of the delayed input clock lags behind the frequency/phase of the count signal.

4. The clock multiplier of claim 2, wherein the phase/frequency detector generates the first control signal when the delayed input clock is received, generates the second control signal when the count signal is received, and resets the first control signal and the second control signal when the first control signal and the second control signal are simultaneously generated or the frequency/phase of the input clock lags behind the frequency/phase of the count signal.

5. The clock multiplier of claim 4, wherein the phase/frequency detector resets the first control signal and the second control signal at a transition time of the count signal when the frequency/phase of the input clock lags behind the frequency/phase of the count signal.

6. The clock multiplier of claim 5, wherein the phase/frequency detector comprises:
an input clock delay unit configured to delay the input clock by the predetermined time;
a phase/frequency detect unit configured to generate the first control signal when the delayed input clock is received, and configured to generate the second control signal when the count signal is received; and
a reset unit configured to reset the first control signal and the second control signal when the first control signal and the second control signal are simultaneously generated or the frequency/phase of the input clock lags behind the frequency/phase of the count signal.

7. The clock multiplier of claim 6, wherein the reset unit resets the first control signal and the second control signal at a transition time of the count signal when the frequency/phase of the input clock lags behind the frequency/phase of the count signal.

8. The clock multiplier of claim 2, wherein the clock selector selects the delayed input clock when the count signal is generated and the clock selector does not receive the delayed input clock, otherwise, the clock selector selects an inverted signal of the feedback clock outputted from the VCDL.

9. The clock multiplier of claim 2, wherein the clock selector comprises:
a mode determination unit configured to receive the count signal and an inverted signal of the delayed input clock; and
a clock selection unit configured to select one of the delayed input clock and an inverted signal of the feedback clock based on an output signal of the mode determination unit.

10. The clock multiplier of claim 9, wherein the clock selection unit selects the delayed input clock when the output signal of the mode determination unit corresponds to the first logic level, and selects the inverted signal of the feedback clock when the output signal of the mode determination unit corresponds to the second logic level.

11. The clock multiplier of claim 1, further comprising:
a loop filter configured to generate the control voltage; and
a pump configured to adjust an amount of charge of the loop filter based on the first control signal and the second control signal.

12. The clock multiplier of claim 11, further comprising:
a counter configured to generate the count signal based on an inverted signal of the feedback clock.

13. The clock multiplier of claim 12, wherein the counter outputs the count signal when the inverted signal of the feedback clock is received at an N-th time.

14. An integrated circuit comprising:
a clock multiplier configured to receive an input clock from an external source and configured to multiply the input clock by N, the clock multiplier including:
a phase/frequency detector configured to generate a first control signal and a second control signal according to a frequency/phase difference between the input clock and a count signal fed thereto, the count signal corresponding to a signal that is generated by delaying the input clock N times;
a clock selector configured to select one of the input clock and a feedback clock based on the input clock and the count signal; and
a voltage-controlled delay line (VCDL) configured to adjust a delay time of the selected signal from the clock selector according to a control voltage that is generated based on the first control signal and the second control signal, and configured to output the feedback clock based on the adjusted delay time.

15. The integrated circuit of claim 14, wherein the phase/frequency detector delays the input clock by a predetermined time, and generates the first control signal and the second control signal based on a frequency/phase difference between the delayed input clock and the count signal.

16. The integrated circuit of claim 15, wherein the phase/frequency detector generates the first control signal when the frequency/phase of the delayed input clock precedes the frequency/phase of the count signal, and generates the second control signal when the frequency/phase of the delayed input clock lags behind the frequency/phase of the count signal.

17. The integrated circuit of claim 15, wherein the phase/frequency detector generates the first control signal when the delayed input clock is received, generates the second control signal when the count signal is received, and resets the first control signal and the second control signal when the first control signal and the second control signal are simultaneously generated or the frequency/phase of the input clock lags behind the frequency/phase of the count signal.

18. The integrated circuit of claim 17, wherein the phase/frequency detector resets the first control signal and the second control signal at a transition time of the count signal when the frequency/phase of the input clock lags behind the frequency/phase of the count signal.

19. The integrated circuit of claim 18, wherein the phase/frequency detector comprises:
an input clock delay unit configured to delay the input clock by the predetermined time;
a phase/frequency detect unit configured to generate the first control signal when the delayed input clock is received, and configured to generate the second control signal when the count signal is received; and
a reset unit configured to reset the first control signal and the second control signal when the first control signal and the second control signal are simultaneously generated or the frequency/phase of the input clock lags behind the frequency/phase of the count signal.

20. The integrated circuit of claim 19, wherein the reset unit resets the first control signal and the second control signal at a transition time of the count signal when the frequency/phase of the input clock lags behind the frequency/phase of the count signal.

21. The integrated circuit of claim 15, wherein the clock selector selects the delayed input clock when the count signal is generated and the clock selector does not receive the delayed input clock, otherwise, the clock selector selects an inverted signal of the feedback clock outputted from the VCDL.

22. The integrated circuit of claim 15, wherein the clock selector comprises:
a mode determination unit configured to receive the count signal and an inverted signal of the delayed input clock; and
a clock selection unit configured to select one of the delayed input clock and an inverted signal of the feedback clock based on an output signal of the mode determination unit.

23. The integrated circuit of claim 22, wherein the clock selection unit selects the delayed input clock when the output signal of the mode determination unit corresponds to a first logic level, and selects the inverted signal of the feedback clock when the output signal of the mode determination unit corresponds to a second logic level.

24. The integrated circuit of claim 14, further comprising:
a loop filter configured to generate the control voltage; and
a pump configured to adjust an amount of charge of the loop filter based on the first control signal and the second control signal.

25. The integrated circuit of claim 24, further comprising:
a counter configured to generate the count signal based on an inverted signal of the feedback clock.

26. The integrated circuit of claim 25, wherein the counter outputs the count signal when the inverted signal of the feedback clock is received at an N-th time.

27. A method of multiplying a clock, comprising:
generating a first control signal and a second control signal according to a frequency/phase difference between an input clock and a count signal, the count signal corresponding to a signal that is generated by delaying the input clock N times;
selecting one of the input clock and a feedback clock based on the input clock and the count signal;
adjusting a delay time of the selected signal in the step of selecting according to a control voltage that is generated based on the first control signal and the second control signal; and
outputting the feedback clock based on the adjusted delay time.

28. The method of claim 27, wherein generating the first control signal and the second control signal comprises:
delaying the input clock by a predetermined time; and
generating the first control signal and the second control signal based on a frequency/phase difference between the delayed input clock and the count signal.

29. The method of claim 28, wherein generating the first control signal and the second control signal based on the frequency/phase difference between the delayed input clock and the count signal comprises:
generating the first control signal when the frequency/phase of the delayed input clock precedes the frequency/phase of the count signal; and
generating the second control signal when the frequency/phase of the delayed input clock lags behind the frequency/phase of the count signal.

30. The method of claim 28, wherein generating the first control signal and the second control signal based on the frequency/phase difference between the delayed input clock and the count signal comprises:
generating the first control signal when the delayed input clock is received;
generating the second control signal when the count signal is received; and
resetting the first control signal and the second control signal when the first control signal and the second control signal are simultaneously generated or the frequency/phase of the input clock lags behind the frequency/phase of the count signal.

31. The method of claim 30, wherein resetting the first control signal and the second control signal comprises:
resetting the first control signal and the second control signal at a transition time of the count signal when the frequency/phase of the input clock lags behind the frequency/phase of the count signal.

32. The method of claim 28, wherein selecting one of the input clock and the feedback clock comprises:
selecting the delayed input clock when the count signal is generated and the clock selector does not receive the delayed input clock; and
otherwise, selecting an inverted signal of the feedback clock outputted from a voltage controlled delay line.

* * * * *